United States Patent
Li et al.

(10) Patent No.: US 7,586,120 B2
(45) Date of Patent: Sep. 8, 2009

(54) ETHYNYLENE ACENE POLYMERS AND ELECTRONIC DEVICES GENERATED THEREFROM

(75) Inventors: Yuning Li, Mississauga (CA); Beng S. Ong, Mississauga (CA); Yiliang Wu, Mississauga (CA)

(73) Assignee: Xerox Corporation, Norwalk, CT (US)

( * ) Notice: Subject to any disclaimer, the term of this patent is extended or adjusted under 35 U.S.C. 154(b) by 481 days.

(21) Appl. No.: 11/399,169

(22) Filed: Apr. 6, 2006

(65) Prior Publication Data

US 2007/0235725 A1 Oct. 11, 2007

(51) Int. Cl.
*H01L 35/24* (2006.01)
*H01L 51/00* (2006.01)

(52) U.S. Cl. .................. 257/40; 257/E51.027
(58) Field of Classification Search ............. 257/40, 257/E51.027
See application file for complete search history.

(56) References Cited

U.S. PATENT DOCUMENTS

| | | | | |
|---|---|---|---|---|
| 5,055,439 A * | 10/1991 | Allen et al. | ............... | 502/158 |
| 5,619,357 A | 4/1997 | Angelopoulos et al. | | |
| 5,777,070 A | 7/1998 | Inbasekaran et al. | | |
| 5,969,376 A | 10/1999 | Bao | | |
| 6,107,117 A | 8/2000 | Bao et al. | | |
| 6,150,191 A | 11/2000 | Bao | | |
| 6,690,029 B1 * | 2/2004 | Anthony et al. | ............... | 257/40 |
| 6,770,904 B2 | 8/2004 | Ong et al. | | |
| 6,795,230 B1 * | 9/2004 | Vincent et al. | ............... | 359/321 |
| 2005/0017311 A1 | 1/2005 | Ong et al. | | |
| 2006/0131570 A1 * | 6/2006 | Meng | ............... | 257/40 |
| 2007/0102696 A1 * | 5/2007 | Brown et al. | ............... | 257/40 |
| 2007/0146426 A1 * | 6/2007 | Nelson et al. | ............... | 347/44 |
| 2007/0176164 A1 * | 8/2007 | Sato et al. | ............... | 257/40 |

FOREIGN PATENT DOCUMENTS

JP 2002275384 A * 9/2002
JP 2002363381 A * 12/2002

OTHER PUBLICATIONS

Manhart et al, "Synthesis and properties of organosilicon polymers containing 9,10-diethynylanthracene units with highly hole-transporting properties," Journal of Organometallic Chemistry, 592, (1999), 52-60.*
Destri et al, "Synthesis and Characterization of New Poly(arylene ethynylene)s Based on 3-Hexyl Multisubstituted Oligothiophene Blocks," Macromol. Chem. Phys. 2001, 202 No. 12, 2572-2580.*

(Continued)

Primary Examiner—Kenneth A Parker
Assistant Examiner—Anthony Ho
(74) *Attorney, Agent, or Firm*—Eugene O. Palazzo; Fay Sharpe LLP

(57) ABSTRACT

An electronic device comprising a polymer of Formula (I)

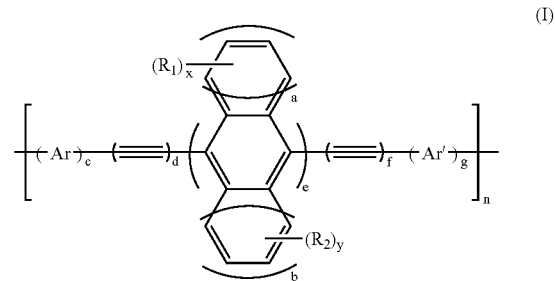

wherein at least one of $R_1$ and $R_2$ is a suitable hydrocarbon, hydrogen, a heteroatom containing group, or a halogen; Ar and Ar' represent an aromatic moiety; x, y, a, b, c, d, e, f, and g represent the number of groups or rings, respectively; and n represents the number of repeating units.

30 Claims, 2 Drawing Sheets

OTHER PUBLICATIONS

Kohler et al, "The Singlet-Triplet Exchange Energy in Conjugated Polymers," Adv. Funct. Mater. 2004, 14, No. 1, Jan. 11-18.*

Ohshita et al, "Hole-transporting properties of organosilanylene-diethynylpyrene and diethynylanthracene alternating polymers. Applications to patterning of light-emitting images," Journal of Organometallic Chemistry 678 (2003) 33-38.*

Yamamoto et al, "Electrical conductivity of π-conjugated polymers with nitro substituents," Macromol. Rapid Commun. 19, 263-266 (1998).*

Naka et al, "π-Conjugated Poly(dithiafulvene) by Cycloaddition Polymerization of Aldothioketene with Its Alkynethiol Tautomer, Polymerization, Optical Properties, and Electrochemical Analysis," Macromolecules 1999, 32, 4641-4646.*

Jiang et al, "Design and Photofunctions of Dendrimer-Encapsulated Poly(Phenyleneethynylene)s," Chinese Journal of Polymer Science vol. 19, No. 2, (2001), 161-166.*

Erdogan et al, "Permanent Bubble Arrays from a Cross-Linked Poly(para-phenyleneethynylene): Picoliter Holes without Microfabrication," J. Am. Chem. Soc. 2004, 126, 3678-3679.*

Kawai et al, "A photoresponsive laser dye containing photochromic dithienylethene units," Chem. Commun., 2001, 711-712.*

Raymo et al, "Optical Processing with Photochromic Switches," Chem. Eur. J. 2006, 12, 3186-3193.*

Lin et al, "Structure-Property Relationships in Conjugated Donor-Acceptor Molecules Based on Cyanoanthracene: Computational and Experimental Studies," J. Org. Chem. 2005, 70, 7397-7407.*

Fukaminato et al, "Digital Photoswitching of Fluorescence Based on the Photochromism of Diarylethene Derivatives at a Single-Molecule Level," J. Am. Chem. Soc. 2004, 126, 14843-14849.*

Kawai et al, "Fluorescence switching of photochromic diarylethenes," Optical Materials 21 (2002) 275-278.*

Machine Translation of JP 2002-275384.*

Machine Translation of JP 2002-363381.*

Ong, Beng, et al., U.S. Appl. No. 11/011,678, filed Dec. 14, 2004 on Compound with Indolocarbazole Moieties and Devices Containing Such Compound.

Ong, Beng, et al., U.S. Appl. No. 11/167,512, filed Jun. 27, 2005 on Compound with Indolocarbazole Moieties and Devices Containing Such Compound.

Huang, D.H., et al., "Conjugated Polymers Based on Phenothiazine and Fluorene in Light-Emitting Diodes and Field Effect Transistors", *Chem. Mater.* 2004, 16, 1298-1303.

Zhu, Y., et al, "Phenoxazine-Based Conjugated Polymers: A New Class of Organic Semiconductors for Field-Effect Transistors", *Macromolecules 2005*, 38, 7983-7991.

* cited by examiner

ETHYNYLENE ACENE POLYMERS AND ELECTRONIC DEVICES GENERATED THEREFROM

STATEMENT REGARDING FEDERALLY SPONSORED RESEARCH OR DEVELOPMENT

The electronic devices and certain components thereof were supported by a United States Government Cooperative Agreement No. 70NANBOH3033 awarded by the National Institute of Standards and Technology (NIST). The United States Government has certain rights relating to the devices and certain semiconductor components illustrated hereinafter.

CROSS-REFERENCE TO RELATED APPLICATIONS

U.S. Pat. No. 7,372,071, filed Apr. 6, 2006, on Functionalized Heteroacenes and Electronic Devices Generated Therefrom, by Yuning Li et al.

U.S. application Ser. No. 11/399,226, filed Apr. 6, 2006, on Functionalized Heteroacenes, by Yuning Li et al.

U.S. application Ser. No. 11/399,216, filed Apr. 6, 2006, on Polyacenes and Electronic Devices Generated Therefrom, by Yuning Li et al.

U.S. application Ser. No. 11/399,064, filed Apr. 6, 2006, on Heteroacene Polymers and Electronic Devices Generated Therefrom, by Yuning Li et al.

U.S. application Ser. No. 11/399,091, filed Apr. 6, 2006, on Ethynylene Acene Polymers, by Yuning Li et al.

U.S. Pat. No. 7,449,715, filed Apr. 6, 2006, on Poly[bis(ethynyl)heteroacenes] and Electronic Devices Generated Therefrom, by Yuning Li et al.

U.S. application Ser. No. 11/399,141, filed Apr. 6, 2006, on Semiconductors and Electronic Devices Generated Therefrom, by Yiliang Wu et al.

U.S. application Ser. No. 11/399,230, filed Apr. 6, 2006, on Semiconductor Polymers by Yiliang Wu et al.

U.S. application Ser. No. 11/398,941, filed Apr. 6, 2006, on Polydiazaacenes and Electronic Devices Generated Therefrom, by Yiliang Wu et al.

U.S. application Ser. No. 11/398,902, filed Apr. 6, 2006, on Polydiazaacenes, by Yiliang Wu et al.

U.S. application Ser. No. 11/398,931, filed Apr. 6, 2006, on Poly(alkynylthiophene)s and Electronic Devices Generated Therefrom, by Beng S. Ong et al.

U.S. application Ser. No. 11/399,246, filed Apr. 6, 2006, on Poly(alkynylthiophene)s, by Beng S. Ong et al.

U.S. application Ser. No. 11/399,092, filed Apr. 6, 2006, on Linked Arylamine Polymers and Electronic Devices Generated Therefrom, by Yuning Li et al.

U.S. application Ser. No. 11/399,065, filed Apr. 6, 2006, on Linked Arylamine Polymers, by Yuning Li et al.

Illustrated in U.S. application Ser. No. 11/011,678 filed Dec. 14, 2004 relating to indolocarbazole moieties and thin film transistor devices thereof.

Illustrated in U.S. application Ser. No. 11/167,512 filed Jun. 27, 2005 relating to indolocarbazole moieties and thin film transistor devices thereof.

Illustrated in U.S. Pat. No. 6,770,904 and copending application U.S. application Ser. No. 10/922,662, Publication No. 20050017311, are electronic devices, such as thin film transistors containing semiconductor layers of, for example, polythiophenes.

The disclosure of each of the above cross referenced applications and patent is totally incorporated herein by reference.

In aspects of the present disclosure, there may be selected the appropriate substituents, such as a suitable hydrocarbon, a heteroatom containing group, hydrogen, halogen, CN, $NO_2$, rings, number of repeating polymer units, number of groups, and the like as illustrated in the copending applications.

The appropriate components, processes thereof and uses thereof illustrated in these copending applications and patent may be selected for the present invention in embodiments thereof.

BACKGROUND

The present disclosure is generally directed to novel polymers, such as ethynylene acene polymers, and uses thereof. More specifically, the present disclosure in embodiments is directed to ethynylene acene polymers selected as solution processable and substantially stable channel semiconductors in organic electronic devices, such as thin film transistors.

There is desired electronic devices, such as thin film transistors, TFTs, fabricated with ethynylene acene polymers, with excellent solvent solubility, which can be solution processable; and devices thereof with mechanical durability and structural flexibility, desirable for fabricating flexible TFTs on plastic substrates. Flexible TFTs would enable the design of electronic devices which usually possesses structural flexibility and mechanical durability characteristics. The use of plastic substrates together with the ethynylene acene polymers can transform the traditionally rigid silicon TFT into a mechanically more durable and structurally flexible TFT design. This can be of particular value to large area devices, such as large-area image sensors, electronic paper and other display media. Also, the selection of ethynylene acene polymer TFTs for integrated circuit logic elements for low end microelectronics, such as smart cards, radio frequency identification (RFID) tags, and memory/storage devices, may enhance their mechanical durability, and thus increase their useful life span.

A number of semiconductor materials are not, it is believed, that stable when exposed to air as they become oxidatively doped by ambient oxygen, resulting in increased conductivity. The result is large off-current and thus low current on/off ratio for the devices fabricated from these materials. Accordingly, with many of these materials, rigorous precautions are usually undertaken during materials processing and device fabrication to exclude environmental oxygen to avoid or minimize oxidative doping. These precautionary measures increase the cost of manufacturing therefore offsetting the appeal of certain semiconductor TFTs as an economical alternative to amorphous silicon technology, particularly for large area devices. These and other disadvantages are avoided or minimized in embodiments of the present disclosure.

REFERENCES

Heteroacenes and acenes like pentacene are known to possess acceptable high field effect mobility when used as channel semiconductors in TFTs. However, these materials are rapidly oxidized by, for example, atmospheric oxygen under light and such compounds are not considered processable at ambient conditions. Furthermore, heteroacenes when selected for TFTs have poor thin film formation characteristics and are insoluble or have minimal solubility in a number of commonly known solvents, rendering these compounds substantially nonsolution processing; accordingly, such materials have been processed by vacuum deposition methods that result in high production costs, eliminated or minimized with the TFTs generated with the ethynylene acene polymers illustrated herein.

A number of organic semiconductor materials has been described for use in field effect TFTs, which materials include organic small molecules, such as pentacene, see for example, D. J. Gundlach et al., "Pentacene organic thin film transistors—molecular ordering and mobility", *IEEE Electron Device Lett.*, Vol. 18, p. 87 (1997); oligomers, such as sexithiophenes or their variants, see for example, reference F. Garnier et al., "Molecular engineering of organic semiconductors: Design of self-assembly properties in conjugated thiophene oligomers", *J. Amer. Chem. Soc.*, Vol. 115, p. 8716 (1993), and poly(3-alkylthiophene), see for example, reference Z. Bao et al., "Soluble and processable regioregular poly(3-hexylthiophene) for field-effect thin film transistor application with high mobility", *Appl. Phys. Lett.* Vol. 69, p 4108 (1996). Although organic material based TFTs generally provide lower performance characteristics than their conventional silicon counterparts, such as silicon crystals or polysilicon TFTs, they may nonetheless be sufficiently useful for applications in areas where high mobility is not of importance. These include large area devices, such as image sensors, active matrix liquid crystal displays and low end microelectronics, such as smart cards and RFID tags. Also, vacuum deposition of the semiconductive layer is selected for a number of TFTs primarily because they are either insoluble or their solution processing by spin coating, solution casting, or stamp printing does not generally provide uniform thin films.

TFTs fabricated from ethynylene acene polymers may be functionally and structurally more desirable than conventional silicon technology in that they offer mechanical durability, structural flexibility, and the potential of being able to be incorporated directly onto the active media of the devices, thus enhancing device compactness for transportability. Polymer TFTs, such as those fabricated from regioregular components of, for example, regioregular poly(3-alkylthiophene-2,5-diyl) by solution processes, while offering some mobility, suffer from their propensity towards oxidative doping in air. For practical low cost TFT design, it is therefore of value to have a semiconductor material that is both stable and solution processable, and where its performance is not adversely affected by ambient oxygen, for example, TFTs generated with poly(3-alkylthiophene-2,5-diyl) are sensitive to air. The TFTs fabricated from these materials in ambient conditions generally exhibit high off-current, very low current on/off ratios, and their performance characteristics degrade rapidly.

Illustrated in Huang, D. H., et al, *Chem. Mater.* 2004, 16, 1298-1303, are, for example, LEDs and field effect transistors based on certain phenothiaazines like poly(10-(2-ethylhexyl) phenothiaazine).

Illustrated in Zhu, Y., et al, *Macromolecules* 2005, 38, 7983-7991, are, for example semiconductors based on phenoxazine conjugated polymers like poly(10-hexylphenoxazine).

Additional references that may be of interest include U.S. Pat. Nos. 6,150,191; 6,107,117; 5,969,376; 5,619,357, and 5,777,070.

BRIEF DESCRIPTION OF THE DRAWINGS

Illustrated in FIGS. 1 to 4 are various representative embodiments of the present disclosure and wherein ethynylene acene polymers are selected as the channel or semiconductor material in thin film transistor (TFT) configurations.

DESCRIPTION OF THE EXEMPLARY EMBODIMENTS

Figure 1:
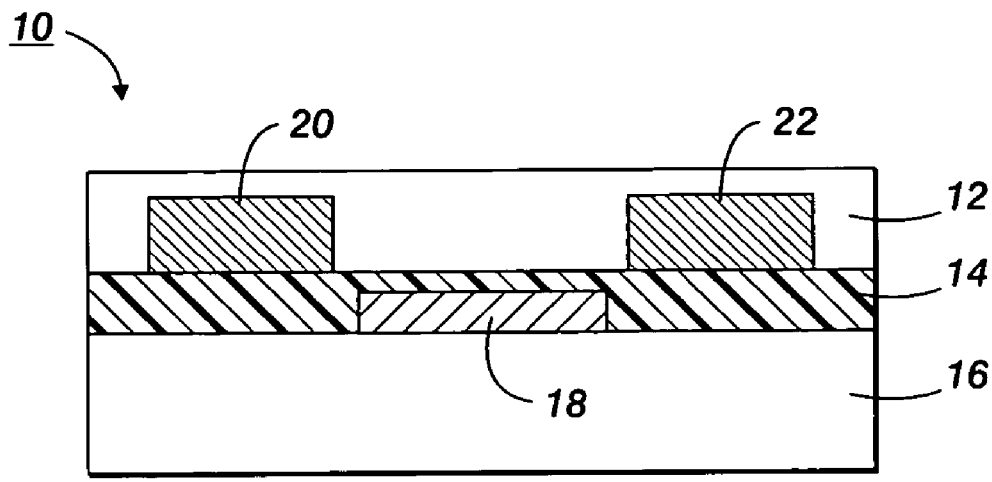

It is a feature of the present disclosure to provide semiconductor ethynylene acene polymers, which are useful for microelectronic device applications, such as TFT devices.

It is another feature of the present disclosure to provide ethynylene acene polymers with a band gap of from about 1.5 eV to about 3 eV as determined from the absorption spectra of thin films thereof, and which ethynylene acene polymers are suitable for use as TFT semiconductor channel layer materials.

In yet a further feature of the present disclosure there are provided ethynylene acene polymers, which are useful as microelectronic components, and which ethynylene acene polymers possess solubility of, for example, at least about 0.1 percent to about 95 percent by weight in known organic solvents, such as methylene chloride, tetrahydrofuran, toluene, xylene, mesitylene, chlorobenzene, and the like, and thus these components can be economically fabricated by solution processes, such as spin coating, screen printing, stamp printing, dip coating, solution casting, jet printing, and the like.

Another feature of the present disclosure resides in providing electronic devices, such as TFTs, with an ethynylene acene polymer channel layer, and which layer has a conductivity of from about $10^{-4}$ to about $10^{-9}$ S/cm (Siemens/centimeter).

Also, in yet another feature of the present disclosure there are provided novel ethynylene acene polymers and devices thereof, and which devices exhibit, it is believed, enhanced resistance to the adverse effects of oxygen, that is, these devices exhibit relatively high current on/off ratios, and their performance does not substantially degrade as rapidly as similar devices fabricated with regioregular poly(3-alkylthiophene-3,5-diyl).

Additionally, in a further feature of the present disclosure there is provided a class of novel ethynylene acene polymers with unique structural features which enable molecular self-alignment under appropriate processing conditions, and which structural features also enhance the stability of device performance. Proper molecular alignment can permit higher molecular structural order in thin films, which can be important to efficient charge carrier transport, thus resulting in higher electrical performance.

There are disclosed in embodiments, ethynylene acene polymers and electronic devices thereof. More specifically, the present disclosure relates to ethynylene acene polymers illustrated by or encompassed by Formula (I) and a semiconductive material containing an ethynylene acene polymer of Formula (I)

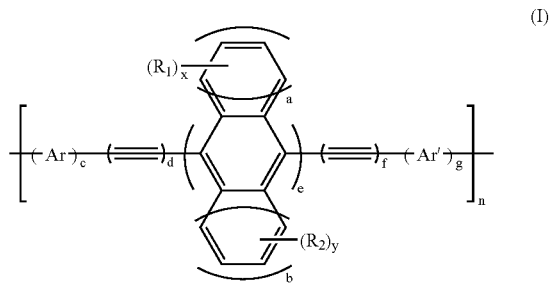

wherein each $R_1$ and $R_2$ is independently a suitable hydrocarbon, such as alkyl with 1 to about 30 carbon atoms like methyl, ethyl, butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, or eicosanyl; aryl with about 6 to about 48 carbon atoms, such as phenyl, tolyl, ethylphenyl, propylphenyl, butylphenyl, pentylphenyl, hexylphenyl, heptylphenyl, octylphenyl, nonylphenyl, decylphenyl, undecylphenyl, dodecylphenyl, tridecylphenyl, tetradecylphenyl, pentadecylphenyl, hexadecylphenyl, heptadecylphenyl, or octadecylphenyl; a heteroatom containing group with zero to about 36 carbon atoms, such as nitro ($NO_2$), cyano (CN); dialkylamino, such as dimethylamino, diethylamino, dipropylamino, dibutylamino; diarylamino such as diphenylamino, ditolylamino, di(ethylphenyl)amino, di(propylphenyl)amino, and di(butylphenyl)amino; alkoxy with from about 1 to about 30 carbon atoms, such as methoxy, ethoxy, propyloxy, butyloxy, pentyloxy, hexyloxy, heptyloxy, ocyloxy, nonyloxy, decyloxy, undecyloxy, dodecyloxy, tridecyloxy, tetradecyloxy, pentadecyloxy, hexadecyloxy, heptadecyloxy, octadecyloxy, nonadecyloxy, or eicosanyloxy; trialkylsilyls such as trimethylsilyl, triethylsilyl, tripropylsilyl, tributylsilyl, tripentylsilyl, and trihexylsilyl; triarylsilyls, such as triphenylsilyl, tritolylsilyl, tri(ethylphenyl)silyl, tri(propylphenyl)silyl, and tri(butylphenyl)silyl, or a halogen such as fluorine, chlorine, bromine, and iodine; Ar and Ar' each independently represents an aromatic moiety; x, y, a, b, c, d, e, f, and g represent the number of groups or rings; and n represents the number of repeating units; Ar and Ar' are aromatic moieties, for example, independently selected from the group consisting of the following structural units which are optionally substituted; and wherein X is selected from the group consisting of C(R'R''), O, S, Se, NR, and Si(R'R''), and wherein R, R', and R'' are independently selected from the group consisting of hydrogen, a suitable hydrocarbon group, such as alkyl with 1 to about 24 carbon atoms, aryl with from about 6 to about 36 carbon atoms; and Y is a carbon atom or a nitrogen atom

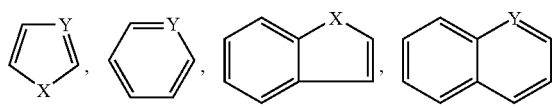

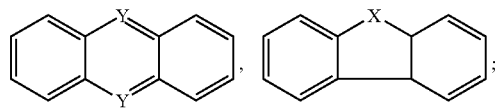

x and y each represent the number of groups and can be from zero to about 12; a and b each represent the number of fused ring moieties and can be, for example, from zero to about 6, and more specifically, wherein each a and b are from about zero to about 5; c represents the number of the aromatic units, Ar, and can be, for example, from zero to about 10, and more specifically, from zero to about 6; e represents the number of acene moieties, and can be, for example, from about 1 to about 10, and more specifically, from about 1 to about 4; d and f each independently represent an alkynyl like ethynyl groups (triple bond) and can be from zero to about 4, and more specifically, from zero to about 2; g represents the number of the aromatic units, Ar', and can be, for example, from zero to about 10, and more specifically, from zero to about 6; n represents the number of repeating units, such as, for example, n is a number of from about 2 to about 5,000, from about 2 to about 1,000, or from about 5 to about 500. The sum of a and b can be, for example, from 1 to about 6, and more specifically, from about 2 to about 4. The sum of c and g can be, for example, from zero to about 20, and more specifically, from zero to about 10; the sum of d and f can be, for example, from 1 to about 4, and more specifically, from 1 to 2.

In embodiments, a class of ethynylene acene polymers are represented by the following formulas/structures

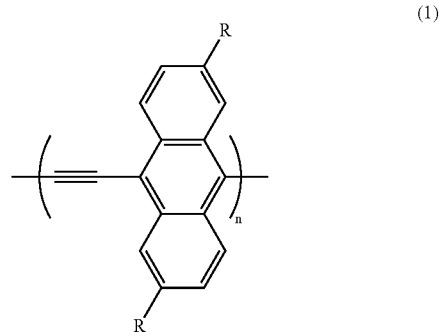

(1)

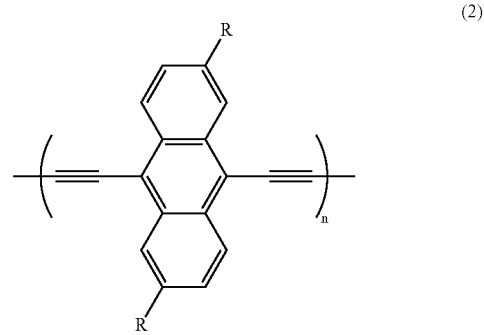

(2)

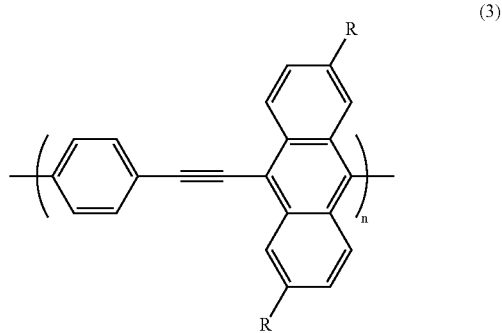

(3)

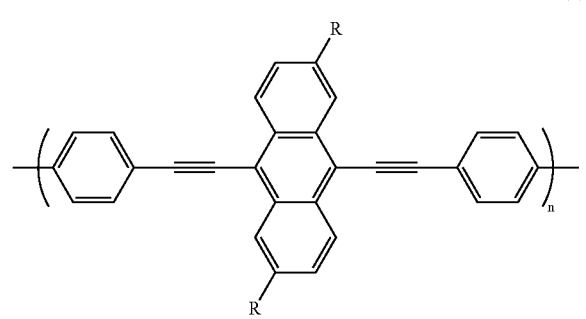

(4)

(5)
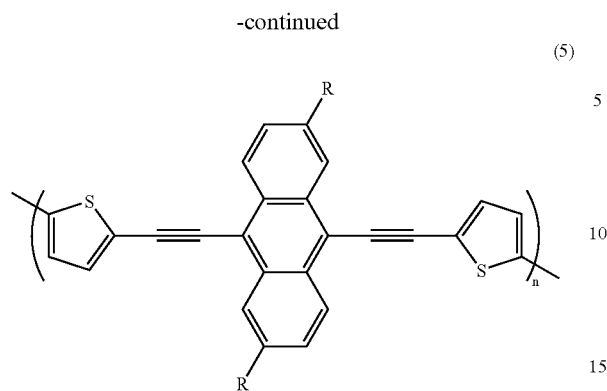
(6)
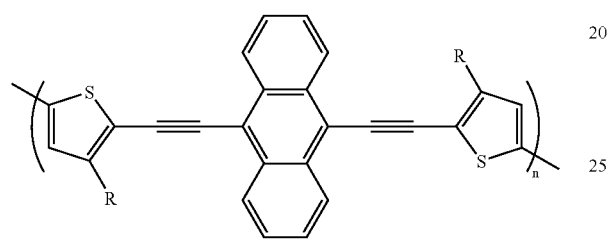
(7)
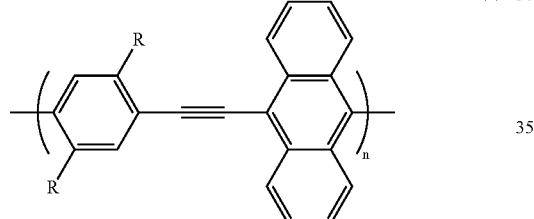
(8)
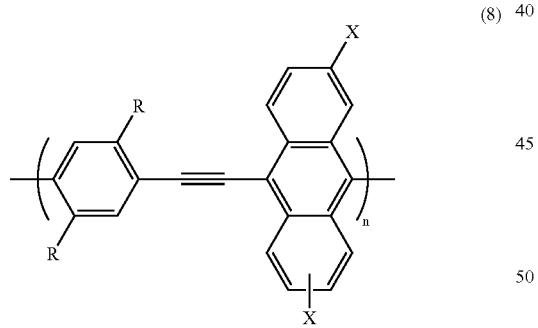
(9)
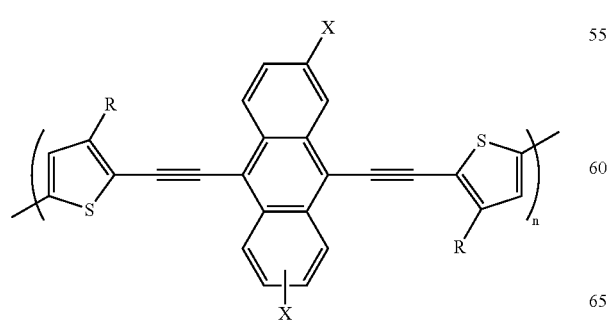
(10)
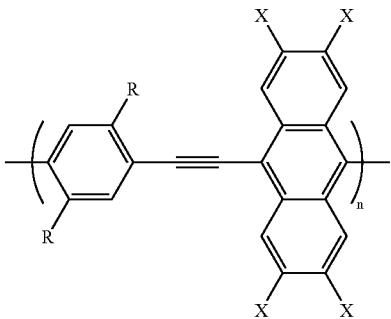
(11)
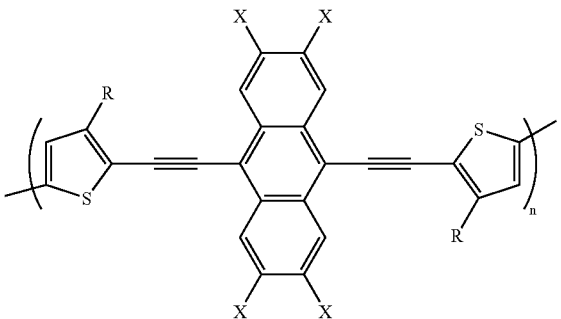
(12)
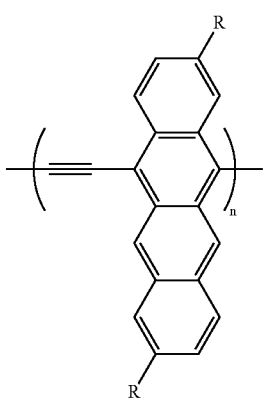
(13)
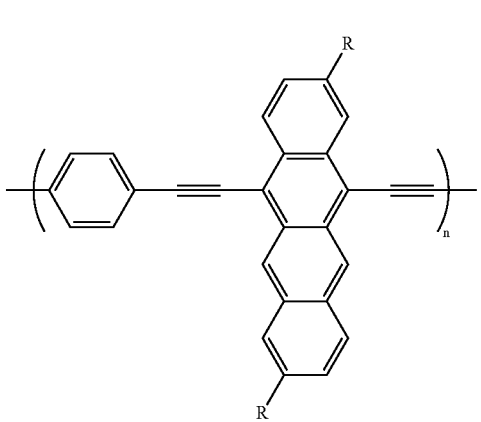

(14)
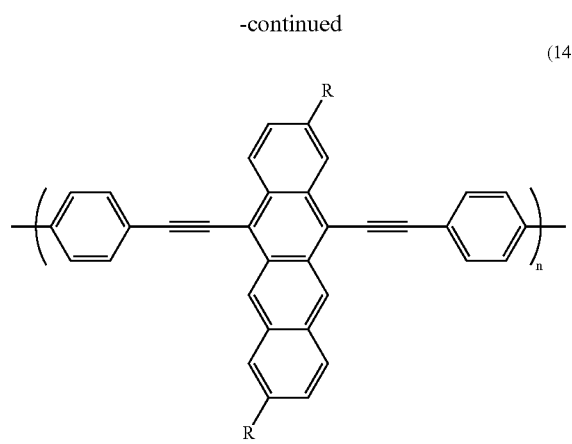
(15)
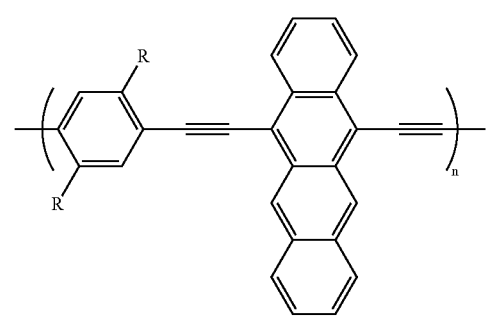
(16)
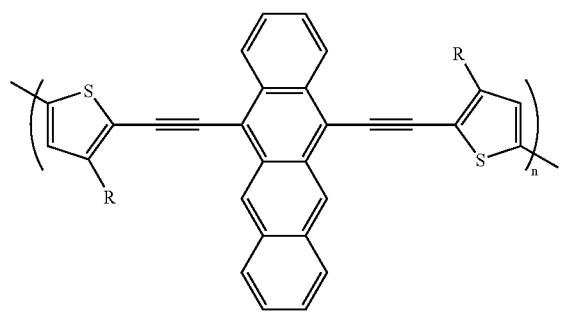
(17)
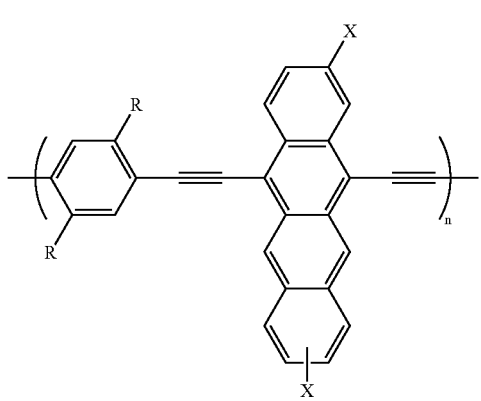
(18)
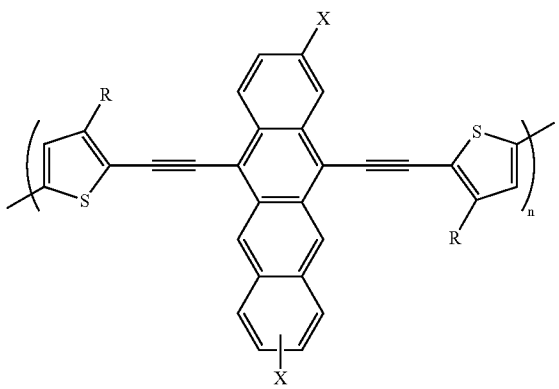
(19)
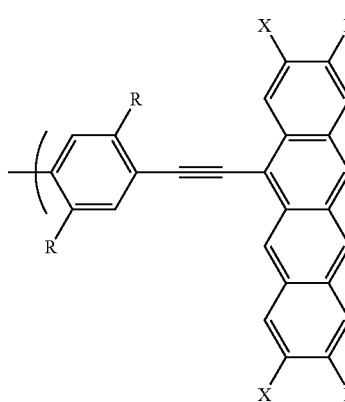
(20)
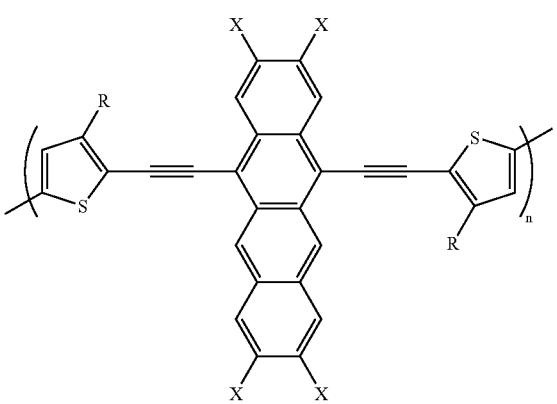

(21)
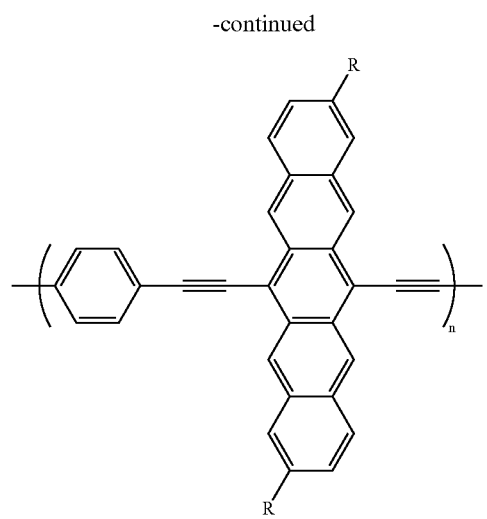

(22)
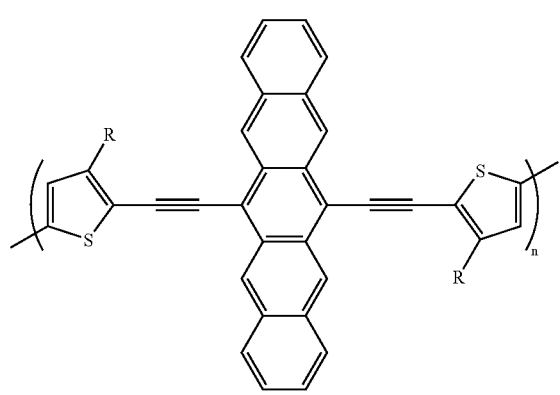

(23)
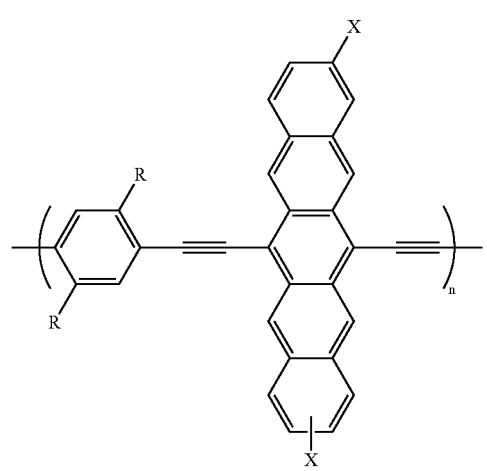

(24)
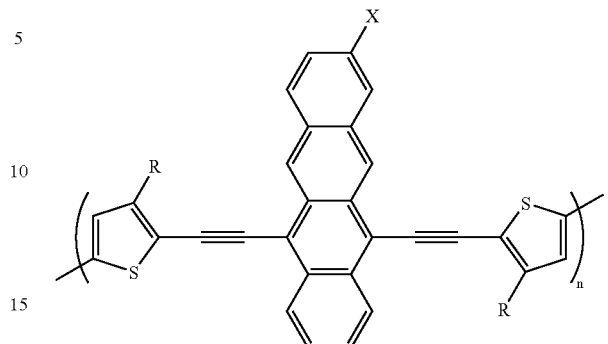

(25)
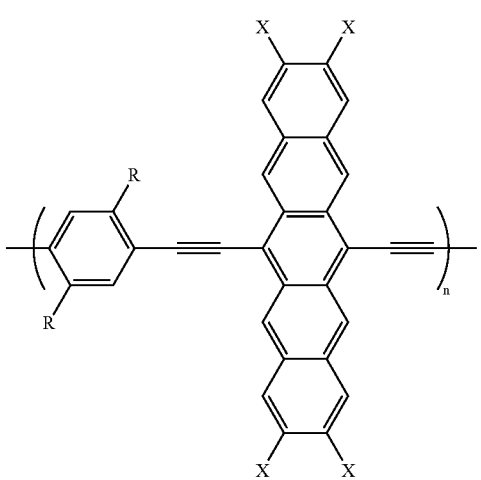

(26)
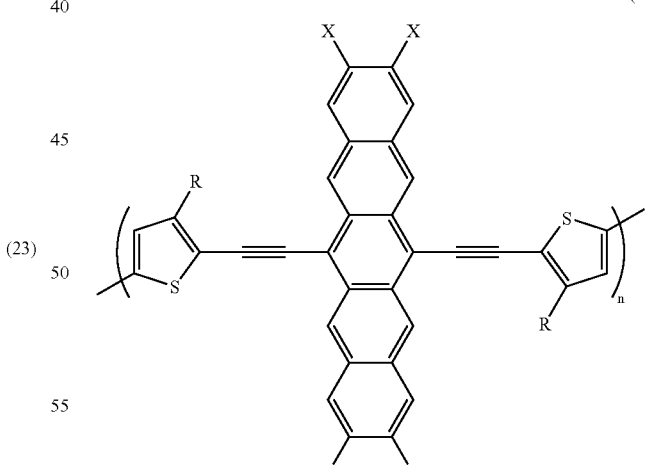

wherein R is an alkyl of butyl, pentyl, hexyl, heptyl, octyl, nonyl, decyl, undecyl, dodecyl, tridecyl, tetradecyl, pentadecyl, hexadecyl, heptadecyl, octadecyl; an aryl of butylphenyl, pentylphenyl, hexylphenyl, heptylphenyl, octylphenyl, nonylphenyl, decylphenyl, undecylphenyl, dodecylphenyl, tridecylphenyl, tetradecylphenyl, pentadecylphenyl, hexadecylphenyl, heptadecylphenyl, or octadecylphenyl; an alkoxy of butyloxy, pentyloxy, hexyloxy, heptyloxy, ocyloxy, nonyloxy, decyloxy, undecyloxy, dodecyloxy, tridecyloxy, tetradecyloxy, pentadecyloxy, hexadecyloxy, heptadecyloxy, octadecyloxy, nonadecyloxy, or eicosanyloxy; and wherein X is methyl, $CF_3$, $NO_2$, CN, F, or Cl; and wherein n is the number of repeating units in the polymer of from about 2 to about 1,000.

In embodiments, a specific class of ethynylene acene polymers are represented by the following formulas/structures

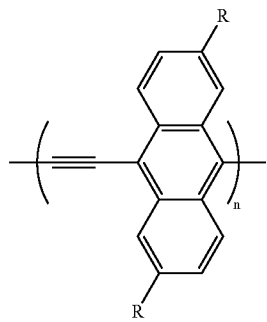

(1)

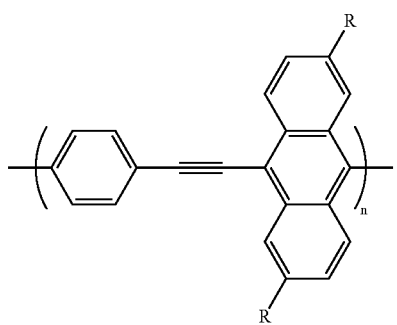

(3)

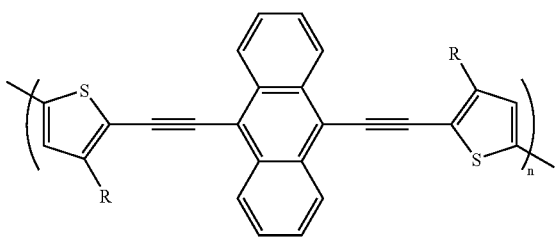

(6)

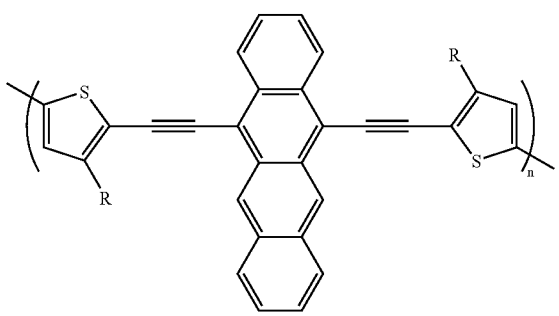

(16)

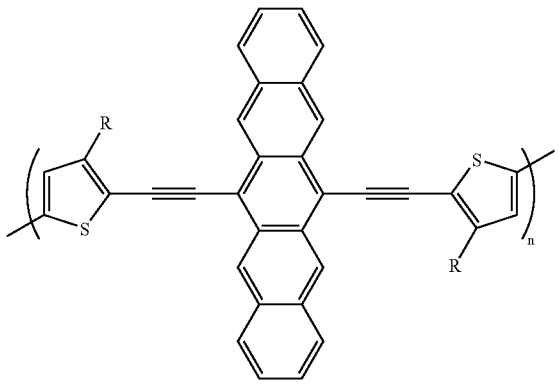

(22)

wherein R is an alkyl of butyl, pentyl, hexyl, heptyl, octyl, nonyl, decyl, undecyl, dodecyl, tridecyl, tetradecyl, pentadecyl, hexadecyl, heptadecyl, octadecyl; an aryl of butylphenyl, pentylphenyl, hexylphenyl, heptylphenyl, octylphenyl, nonylphenyl, decylphenyl, undecylphenyl, dodecylphenyl, tridecylphenyl, tetradecylphenyl, pentadecylphenyl, hexadecylphenyl, heptadecylphenyl, or octadecylphenyl; an alkoxy of butyloxy, pentyloxy, hexyloxy, heptyloxy, ocyloxy, nonyloxy, decyloxy, undecyloxy, dodecyloxy, tridecyloxy, tetradecyloxy, pentadecyloxy, hexadecyloxy, heptadecyloxy, octadecyloxy, nonadecyloxy, or eicosanyloxy; and wherein n is the number of repeating units in the polymer of from about 2 to about 100.

Suitable hydrocarbons are alkyl and alkoxy with, for example, from about 1 to about 30 carbon atoms, from 1 to about 24 carbon atoms, or from 1 to about 10 carbon atoms, while aryl contains, for example, from 6 to about 48 carbon atoms, from 6 to about 36, or from 6 to about 18 carbon atoms. Other known suitable hydrocarbons may also be selected including, for example, substituted alkyl, substituted aryl, alkylaryl, and the like. Examples of heteroatoms are selenium, oxygen, sulfur, and the like. Heteroatom containing groups are as illustrated herein wherein alkyl and alkoxy are as described with regard to Formula (I), and wherein phenyl can be an aryl group. $R_1$ and $R_2$ may in embodiments also be a hydrogen atom or a halogen, x and y can be from zero to 16; a, b, c, and f can be from zero to 6; d and e can be from 1 to 4; and n can be 25 to about 1,000.

The ethynylene acene polymers in embodiments are soluble or substantially soluble in common coating solvents, for example, in embodiments they possess a solubility of at least about 0.1 percent by weight, and more specifically, from about 0.5 percent to about 95 percent by weight in such solvents as methylene chloride, 1,2-dichloroethane, tetrahydrofuran, toluene, xylene, mesitylene, chlorobenzene, dichlorobenzene, and the like. Moreover, the ethynylene acene polymers of the present disclosure in embodiments when fabricated as semiconductor channel layers in TFT devices may provide a stable conductivity of, for example, from about $10^{-9}$ S/cm to about $10^{-4}$ S/cm, and more specifically, from about $10^{-8}$ S/cm to about $10^{-5}$ S/cm as determined by conventional four-probe conductivity measurements.

It is believed that the ethynylene acene polymers, when fabricated from solutions as thin films are, for example, from about 10 nanometers to about 500 nanometers or from about 100 to about 350 nanometers in thickness, are more stable in ambient conditions than similar devices fabricated from a number of know semiconductive materials. When unprotected, electronic devices containing the aforementioned ethynylene acene polymer materials are generally stable for a number of weeks rather than days or hours as is the situation with poly(3-alkylthiophene-2,5-diyl) after exposure to ambient oxygen, thus the devices fabricated from the ethynylene acene polymers in embodiments of the present disclosure can provide higher current on/off ratios, and their performance characteristics do not substantially change as rapidly as that of poly(3-alkylthiophene-2,5-diyl) when no rigorous procedural precautions have been taken to exclude ambient oxygen during material preparation, device fabrication, and evaluation. The ethynylene acene polymers stability of the present disclosure in embodiments against oxidative doping, particularly for low cost device manufacturing, do not usually have to be usually processed in an inert atmosphere and the processes thereof are, therefore, simpler and more cost effective, and the fabrication thereof can be applied to large scale production processes.

A process for the preparation of the ethynylene acene polymers is represented by reaction Scheme 1.

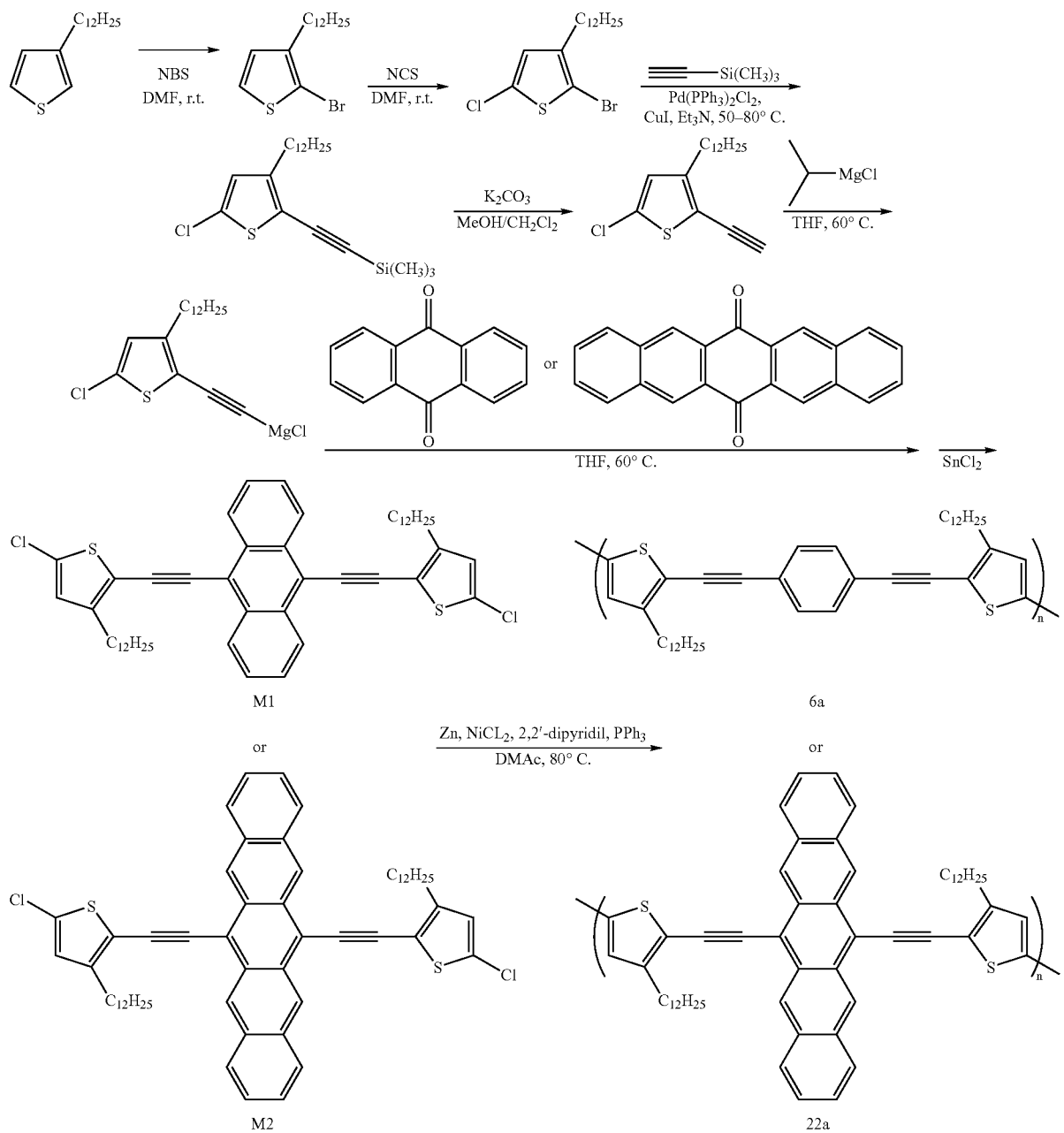

First, 2-bromo-5-chloro-3-dodecylthiophene can be prepared by brominating 3-dodecylthiophene with 1 molar equivalent of N-bromosuccinimide (NBS) in N,N-dimethylformamide (DMF) at room temperature (rt) (as used herein, "room temperature" refers, for example, to a temperature ranging from about 22° C. to about 25° C.). Next, the chlorination of 2-bromo-3-dodecylthiophene with 1 molar equivalent of N-chlorosuccinimide (NCS) at room temperature generates 2-bromo-5-chloro-3-dodecylthiophene. Subsequently, 2-bromo-5-chloro-3-dodecylthiophene is reacted with a trimethylsilylacetylene in the presence of dichlorobis(triphenylphosphine) palladium (II) ($Pd(PPh_3)_2Cl_2$) and copper (I) iodide (CuI) in triethylamine ($Et_3N$) at elevated temperatures, such as 50° C. for a suitable time like 24 hours, and 80° C. for 3 hours under argon to form 5-chloro-3-dodecyl-2-(trimethylsilyl)ethynylthiophene. 5-Chloro-3-dodecyl-2-(trimethylsilyl)ethynylthiophene is stirred in a mixture of methanol/dichloromethane (1/2, v/v) in the presence of 10 percent mol of potassium carbonate at room temperature for a suitable time like 16 hours to produce 5-chloro-3-dodecyl-2-ethynylthiophene. 5-Chloro-3-dodecyl-2-ethynylthiophene is then reacted with isopropylmagnesium chloride, and then with anthraquinone or 6,13-pentacenequinone at 50° C. in tetrahydrofuran (THF) under argon, followed by reduction with tin (II) chloride ($SnCl_2$) solution in 10 percent HCl at elevated temperatures like 50° C. The resultant 9,10-bis(5-chloro-3-dodecylthienylethynyl)anthracene (M1) or 6,13-bis(5-chloro-3-dodecylthienylethynyl) pentacene (M2) is polymerized using zinc in the presence of nickel (II) chloride ($NiCl_2$), 2,2'-dipyridil, triphenylphosphine ($PPh_3$) in N,N-dimethylacetamide (DMAc) at elevated temperatures like 80° C. for a suitable time like 48 hours. Poly(9,10-bis(3-dodecylthienylethynyl)anthracene (6a) and poly(6,13-bis(3-dodecylthienylethynyl) pentacene (22a) are thus obtained.

Aspects of the present disclosure relate to an electronic device containing the ethynylene acene polymers illustrated herein; a device which is a thin film transistor comprised of a substrate, a gate electrode, a gate dielectric layer, a source electrode and a drain electrode, and in contact with the source/drain electrodes and the gate dielectric layer, a semiconductor layer comprised of the ethynylene acene polymers illustrated herein; an electronic device, such as a thin film transistor, comprising a polymer of Formula (I)

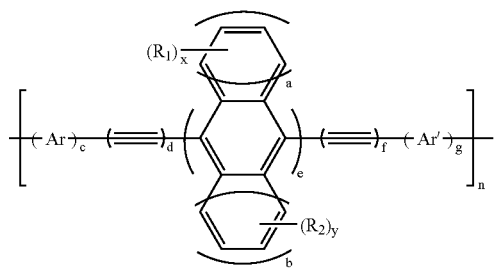

wherein at least one of $R_1$ and $R_2$ is a suitable hydrocarbon, such as alkyl, aryl, and the like; hydrogen, a heteroatom containing group, a halogen and the like; Ar and Ar' represent an aromatic moiety; x, y, a, b, c, d, e, f, and g represent the number of groups or rings, respectively; and n represents the number of repeating units; a thin film transistor comprised of a substrate, a gate electrode, a gate dielectric layer, a source electrode and a drain electrode, and in contact with the source/drain electrodes and the gate dielectric layer a semiconductor layer comprised of an ethynylene acene polymer of the formula

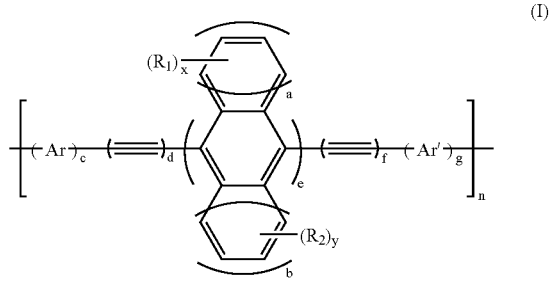

wherein at least one of $R_1$ and $R_2$ is a hydrocarbon, such as alkyl, aryl, substituted alkyl, substituted aryl, alkoxy, substituted alkoxy, and the like, hydrogen, a heteroatom containing group, or a halogen; Ar and Ar' represent an aromatic moiety; x, y, a, b, c, d, e, f, and g represent the number of groups; and n represents the number of repeating units; a TFT device wherein the substrate is a plastic sheet of a polyester, a polycarbonate, or a polyimide; the gate source and drain electrodes are each independently comprised of gold, nickel, aluminum, platinum, indium titanium oxide, or a conductive polymer, and the gate dielectric is a dielectric layer comprised of silicon nitride or silicon oxide; a TFT device wherein the substrate is glass or a plastic sheet; said gate, source and drain electrodes are each comprised of gold, and the gate dielectric layer is comprised of the organic polymer poly(methacrylate), or poly(vinyl phenol); a device wherein the ethynylene acene polymer layer is formed by solution processes of spin coating, stamp printing, screen printing, or jet printing; a device wherein the gate, source and drain electrodes, the gate dielectric, and semiconductor layers are formed by solution processes of spin coating, solution casting, stamp printing, screen printing, or jet printing; and a TFT device wherein the substrate is a plastic sheet of a polyester, a polycarbonate, or a polyimide, and the gate, source and drain electrodes are fabricated from the organic conductive polymer polystyrene sulfonate-doped poly(3,4-ethylene dioxythiophene), or from a conductive ink/paste compound of a colloidal dispersion of silver in a polymer binder, and the gate dielectric layer is organic polymer or inorganic oxide particle-polymer composite; device or devices include electronic devices, such as TFTs.

DETAILED DESCRIPTION OF THE FIGURES

In FIG. 1 there is schematically illustrated a TFT configuration 10 comprised of a substrate 16, in contact therewith a metal contact 18 (gate electrode), and a layer of an insulating dielectric layer 14 with the gate electrode having a portion thereof or the entire gate in contact with the dielectric layer 14, on top of which layer 14 two metal contacts, 20 and 22 (source and drain electrodes), are deposited. Over and between the metal contacts 20 and 22 is the ethynylene acene polymer poly(9,10-bis(3-dodecylthienylethynyl)anthracene) (6a) or poly(6,13-bis(3-dodecylthienylethynyl)pentacene) (22a) layer 12. The gate electrode can be included in the substrate, in the dielectric layer, and the like throughout.

Figure 2:
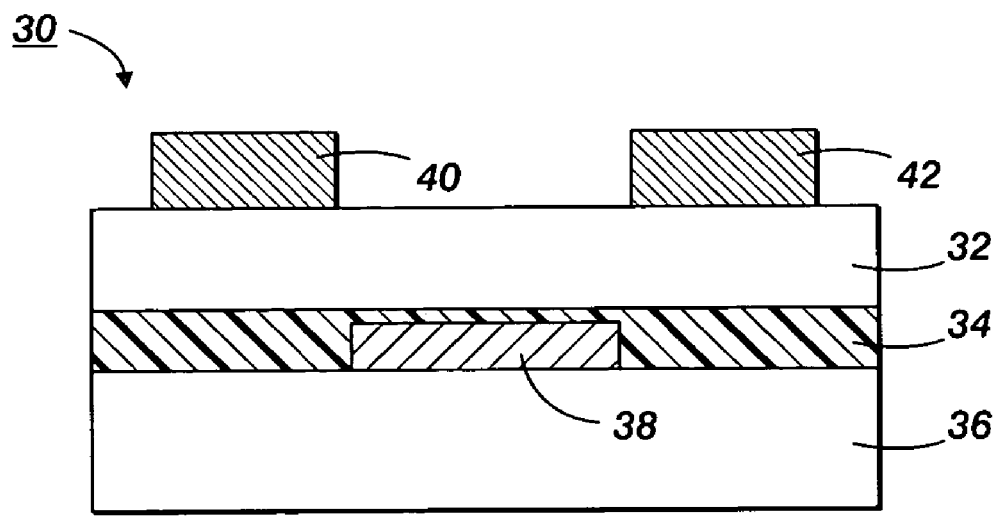

FIG. 2 schematically illustrates another TFT configuration 30 comprised of a substrate 36, a gate electrode 38, a source electrode 40, and a drain electrode 42, an insulating dielectric layer 34, and the ethynylene acene polymer poly(9,10-bis(3-dodecylthienylethynyl)anthracene) (6a) semiconductor layer 32.

Figure 3:
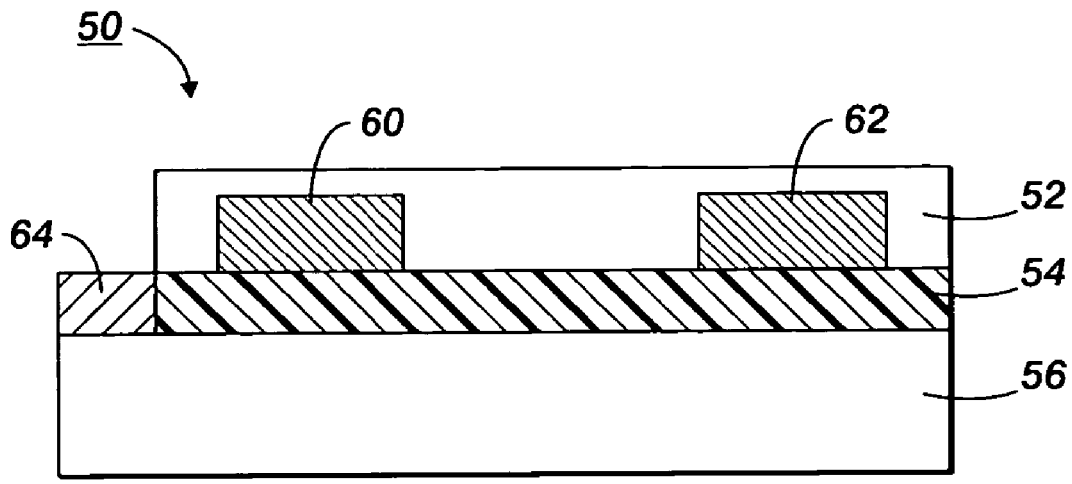

FIG. 3 schematically illustrates a further TFT configuration 50 comprised of a heavily n-doped silicon wafer 56, which can act as a gate electrode, a thermally grown silicon oxide dielectric layer 54, the ethynylene acene polymer poly (9,10-bis(3-dodecylthienylethynyl)anthracene) (6a) semiconductor layer 52, on top of which are deposited a source electrode 60 and a drain electrode 62; and a gate electrode contact 64.

Figure 4:
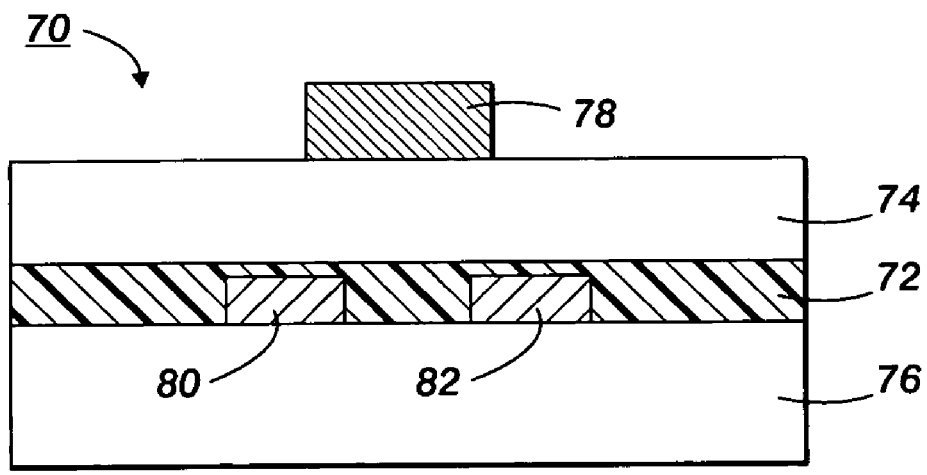

FIG. 4 schematically illustrates a TFT configuration 70 comprised of substrate 76, a gate electrode 78, a source electrode 80, a drain electrode 82, the ethynylene acene polymer poly(9,10-bis(3-dodecylthienylethynyl)anthracene) (6a) semiconductor layer 72, and an insulating dielectric layer 74.

Also, other devices not disclosed, especially TFT devices, are envisioned, reference for example known TFT devices.

In embodiments of the present disclosure, an optional protecting layer may be incorporated on top of each of the transistor configurations of FIGS. 1, 2, 3 and 4. For the TFT configuration of FIG. 4, the insulating dielectric layer 74 may also function as a protecting layer.

In embodiments and with further reference to the present disclosure and the Figures, the substrate layer may generally be a silicon material inclusive of various appropriate forms of silicon, a glass plate, a plastic film or a sheet, and the like depending on the intended applications. For structurally flexible devices, a plastic substrate, such as for example polyester, polycarbonate, polyimide sheets, and the like, may be selected. The thickness of the substrate may be, for example, from about 10 micrometers to over 10 millimeters with a specific thickness being from about 50 to about 100 micrometers, especially for a flexible plastic substrate and from about 1 to about 10 millimeters for a rigid substrate, such as glass or silicon.

The insulating dielectric layer, which can separate the gate electrode from the source and drain electrodes, and in contact with the semiconductor layer, can generally be an inorganic material film, an organic polymer film, or an organic-inorganic composite film. The thickness of the dielectric layer is, for example, from about 10 nanometers to about 1 micrometer with a more specific thickness being about 100 nanometers to about 500 nanometers. Illustrative examples of inorganic materials suitable as the dielectric layer include silicon oxide, silicon nitride, aluminum oxide, barium titanate, barium zirconate titanate, and the like; illustrative examples of organic polymers for the dielectric layer include polyesters, polycarbonates, poly(vinyl phenol), polyimides, polystyrene, poly(methacrylate)s, poly(acrylate)s, epoxy resin, and the like; and illustrative examples of inorganic-organic composite materials include nanosized metal oxide particles dispersed in polymers such as polyester, polyimide, epoxy resin and the like. The insulating dielectric layer is generally of a thickness of from about 50 nanometers to about 500 nanometers depending on the dielectric constant of the dielectric material used. More specifically, the dielectric material has a dielectric constant of, for example, at least about 3, thus a suitable dielectric thickness of about 300 nanometers can provide a desirable capacitance, for example, of about $10^{-9}$ to about $10^{-7}$ F/cm$^2$.

Situated, for example, between and in contact with the dielectric layer and the source/drain electrodes is the active semiconductor layer comprised of the ethynylene acene polymers illustrated herein, and wherein the thickness of this layer is generally, for example, about 10 nanometers to about 1 micrometer, or about 40 to about 100 nanometers. This layer can generally be fabricated by solution processes such as spin coating, casting, screen, stamp, or jet printing of a solution of the ethynylene acene polymers of the present disclosure.

The gate electrode can be a thin metal film, a conducting polymer film, a conducting film generated from a conducting ink or paste, or the substrate itself (for example heavily doped silicon). Examples of gate electrode materials include, but are not limited to aluminum, gold, chromium, indium tin oxide, conducting polymers, such as polystyrene sulfonate-doped poly(3,4-ethylenedioxythiophene) (PSS/PEDOT), a conducting ink/paste comprised of carbon black/graphite or colloidal silver dispersion contained in a polymer binder, such as Electrodag available from Acheson Colloids Company, and silver filled electrically conductive thermoplastic ink available from Noelle Industries, and the like. The gate layer can be prepared by vacuum evaporation, sputtering of metals or conductive metal oxides, coating from conducting polymer solutions or conducting inks or dispersions by spin coating, casting or printing. The thickness of the gate electrode layer is, for example, from about 10 nanometers to about 10 micrometers, and a specific thickness is, for example, from about 10 to about 200 nanometers for metal films and about 1 to about 10 micrometers for polymer conductors.

The source and drain electrode layer can be fabricated from materials which provide a low resistance ohmic contact to the semiconductor layer. Typical materials suitable for use as source and drain electrodes include those of the gate electrode materials such as gold, nickel, aluminum, platinum, conducting polymers, and conducting inks. Typical thickness of this layer is, for example, from about 40 nanometers to about 1 micrometer with the more specific thickness being about 100 to about 400 nanometers. The TFT devices contain a semiconductor channel with a width W and length L. The semiconductor channel width may be, for example, from about 10 micrometers to about 5 millimeters with a specific channel width being about 100 micrometers to about 1 millimeter. The semiconductor channel length may be, for example, from about 1 micrometer to about 1 millimeter with a more specific channel length being from about 5 micrometers to about 100 micrometers.

The source electrode is grounded and a bias voltage of generally, for example, about 0 volt to about −85 volts is applied to the drain electrode to collect the charge carriers transported across the semiconductor channel when a voltage of generally about +10 volts to about −80 volts is applied to the gate electrode.

Other known materials not recited herein for the various components of the TFT devices of the present disclosure can also be selected in embodiments.

Although not desiring to be limited by theory, it is believed that the ethynyl groups function primarily to minimize or avoid instability because of exposure to oxygen and thus increase the oxidative stability of the ethynylene acene polymers in solution under ambient conditions, and the substituents or groups permit the solubility of these compounds in common solvents, such as ethylene chloride.

The claims, as originally presented and as they may be amended, encompass variations, alternatives, modifications, improvements, equivalents, and substantial equivalents of the embodiments and teachings disclosed herein, including those that are presently unforeseen or unappreciated, and that, for example, may arise from applicants/patentees and others. Unless specifically recited in a claim, steps or components of claims should not be implied or imported from the specification or any other claims as to any particular order, number, position, size, shape, angle, color, or material.

The invention claimed is:

1. An electronic device comprising a polymer of Formula (I)

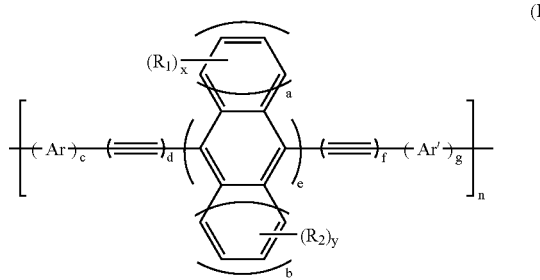

wherein $R_1$ and $R_2$ are independently alkyl with 1 to about 30 carbon atoms, aryl with about 6 to about 48 carbon atoms, a heteroatom containing group, alkoxy with about 1 to about 30 carbon atoms, trialkylsilyl, triarylsilyl, or halogen; Ar and Ar' are independently an aromatic moiety; x and y are each independently from zero to 16; a and b are each independently from zero 1 to about 6; c and g are each independently from zero to about 10; d is from zero to about 4, f is from zero to about 6, and the sum of d and f is from 1 to about 6; e is from about 1 to about 10; and n is from 2 to about 5,000.

2. A device in accordance with claim 1 wherein Ar and Ar' are independently selected from the group consisting of the following structural units

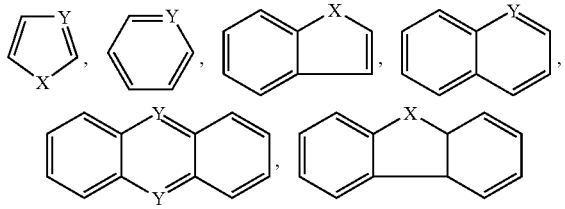

wherein X is selected from the group consisting of C(R'R''), O, S, Se, NR, and Si(R'R''); and wherein R, R', and R'' are independently selected from the group consisting of hydrogen, alkyl and aryl; and Y is a carbon atom or a nitrogen atom.

3. A device in accordance with claim 1 wherein at least one of $R_1$ and $R_2$ is hydrogen.

4. A device in accordance with claim 1 wherein Ar or Ar' contains from 6 to about 36 carbon atoms.

5. A device in accordance with claim 1 wherein at least one of $R_1$ and $R_2$ is alkyl.

6. A device in accordance with claim 1 wherein at least one of $R_1$ and $R_2$ is aryl.

7. A device in accordance with claim 1 wherein at least one of $R_1$ and $R_2$ is alkoxy.

8. A device in accordance with claim 1 wherein at least one of $R_1$ and $R_2$ is halogen.

9. A device in accordance with claim 1 wherein at least one of $R_1$ and $R_2$ is cyano or nitro.

10. A device in accordance with claim 1 wherein each x and y independently represents a number of from zero to about 16.

11. A device in accordance with claim 1 wherein each x and y independently represents a number of from zero to about 6.

12. A device in accordance with claim 1 wherein each x and y independently represents zero; and wherein at least one of Ar or Ar' is substituted.

13. A device in accordance with claim 1 wherein c and g each independently represents a number of from zero to about 4, and wherein the sum of c and g is from zero to about 4.

14. A device in accordance with claim 1 wherein c and g each independently represents a number of from zero to about 2, and wherein the sum of c and g is from zero to about 2.

15. A device in accordance with claim 1 wherein d and f each independently represents a number of from zero to about 4.

16. A device in accordance with claim 1 wherein d and f each independently represents a number of from zero to about 2, and wherein the sum of d and f is from 1 to about 4; wherein d and f each independently represents a number of from zero to about 2, and wherein the sum of d and f is from 1 to about 2; or wherein d and f each independently represents a number of from zero to about 1, and wherein the sum of d and f is 1.

17. A device in accordance with claim 1 wherein e represents a number of from about 1 to about 4.

18. A device in accordance with claim 1 wherein n represents a number from 2 to about 100.

19. A device in accordance with claim 1 wherein n represents a number of from about 10 to about 200.

20. A thin film transistor comprised of a substrate, a gate electrode, a gate dielectric layer, a source electrode and a drain electrode, and in contact with the source/drain electrodes and the gate dielectric layer a semiconductor layer comprised of an ethynylene acene polymer of the formula

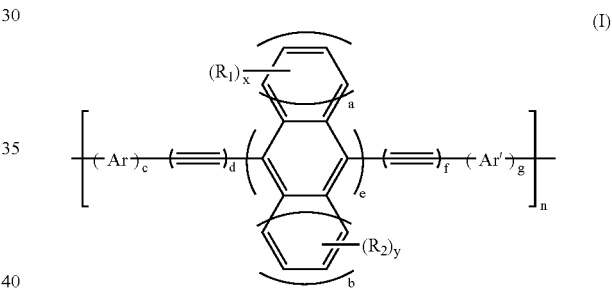

wherein $R_1$ and $R_2$ are independently alkyl, substituted alkyl, alkoxy, substituted alkoxy, aryl, substituted aryl, a heteroatom containing group, trialkylsilyl, triarylsilyl, or halogen; Ar and Ar' are independently an aromatic moiety; x and y are each independently from zero to 16; a and b are each independently from 1 to about 6; c and g are each independently from zero to about 10; d is from zero to about 4, f is from zero to about 6, and the sum of d and f is from 1 to about 6; e is from about 1 to about 10; and n is from 2 to about 5,000.

21. A device in accordance with claim 20 wherein at least one of $R_1$ and $R_2$ is butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, or eicosanyl.

22. A device in accordance with claim 20 wherein at least one of $R_1$ and $R_2$ is phenyl, tolyl, butylphenyl, pentylphenyl, hexylphenyl, heptylphenyl, octylphenyl, nonylphenyl, decylphenyl, undecylphenyl, dodecylphenyl, tridecylphenyl, tetradecylphenyl, pentadecylphenyl, hexadecylphenyl, heptadecylphenyl, or octadecylphenyl.

23. A device in accordance with claim 20 wherein at least one of $R_1$ and $R_2$ is methoxy, ethoxy, propyloxy, butyloxy, pentyloxy, hexyloxy, heptyloxy, ocyloxy, nonyloxy, decyloxy, undecyloxy, dodecyloxy, tridecyloxy, tetradecyloxy, pentadecyloxy, hexadecyloxy, heptadecyloxy, octadecyloxy, nonadecyloxy, or eicosanyloxy.

24. A device in accordance with claim 20 wherein at least one of $R_1$ and $R_2$ is fluorine, chlorine, bromine, or iodine.

25. A device in accordance with claim 20 wherein said ethynylene acene polymer is one of the following formulas/structures (1)
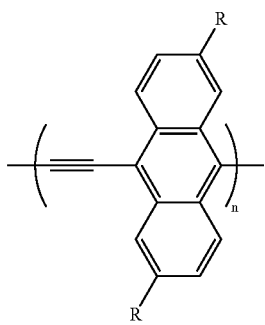

(3)
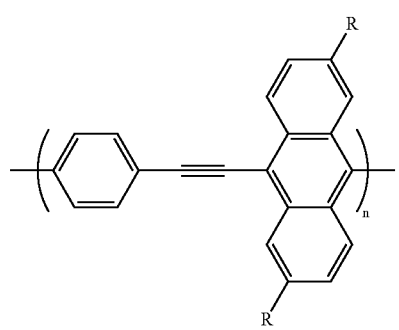

(6)
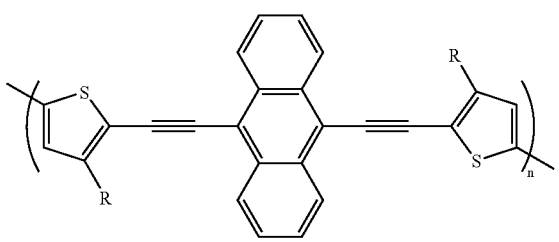

(16)
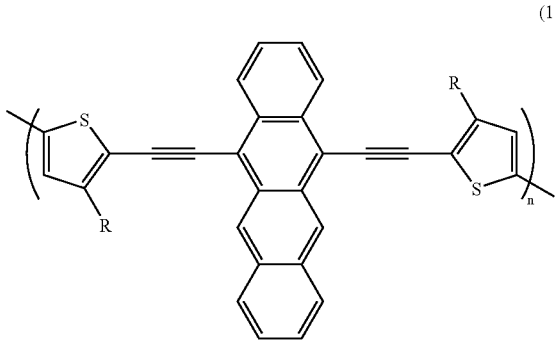

-continued

(22)
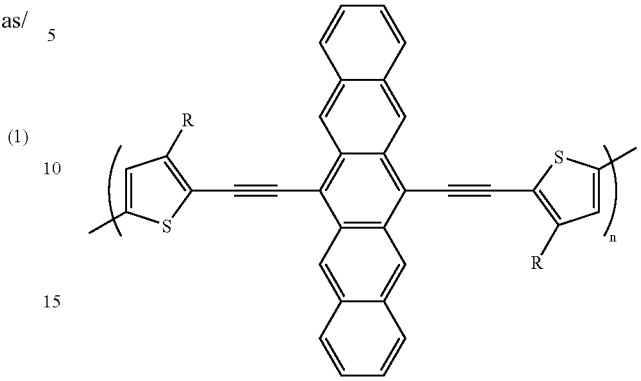

wherein R is alkyl having from 4 to 18 carbon atoms, phenyl substituted with one alkyl chain having 4 to 18 carbon atoms, or alkoxy having from 4 to 20 carbon atoms; and wherein n is from about 10 to about 100.

26. A device in accordance with claim 20 wherein said substrate is a plastic sheet of a polyester, a polycarbonate, or a polyimide; said gate, source, and drain electrodes are each independently comprised of silver, gold, nickel, aluminum, chromium, platinum, indium titanium oxide, or a conductive polymer; and said gate dielectric layer is comprised of inorganic nitrides or oxides, or organic polymers, silicon nitride, silicon oxide; and wherein said ethynylene acene polymer is deposited by solution processes of spin coating, stamp printing, screen printing, or jet printing.

27. A device in accordance with claim 20 wherein the heteroatom containing group is nitro ($NO_2$), cyano (CN), dialkylamino, diarylamino, alkoxy having from 1 to 20 carbon atoms, trialkylsilyl, or triarylsilyl.

28. A device in accordance with claim 20 wherein the thin film transistor field effect mobility is at least about 0.02 $cm^2$/V·sec, and the current on/off ratio is at least $10^4$; wherein the field effect mobility is at least 0.05 $cm^2$/V·sec, and the current on/off ratio is equal to or greater than about $10^5$; or wherein the field effect mobility is at least 0.1 $cm^2$/V·sec, and the current on/off ratio is equal to or greater than larger $10^6$.

29. A device in accordance with claim 20 wherein at least one of $R_1$ and $R_2$ is alkyl, substituted alkyl, alkoxy, substituted alkoxy, aryl, or substituted aryl.

30. A thin film transistor comprising a polymer having a structure selected from formulas (1) through (26):

(1)
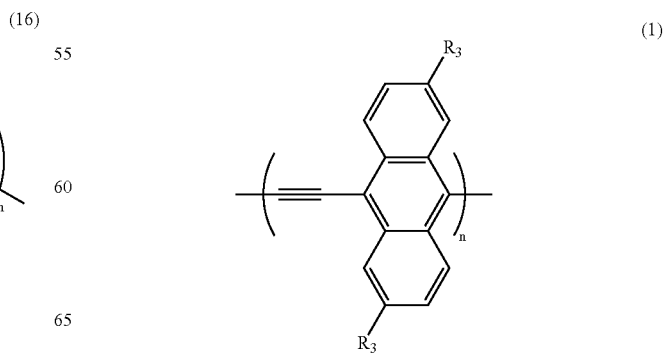

-continued
(2)
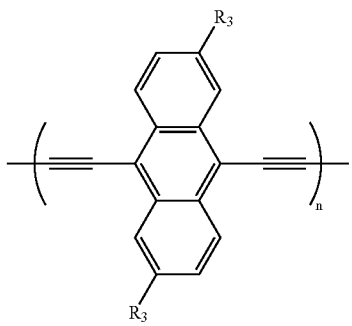
(3)
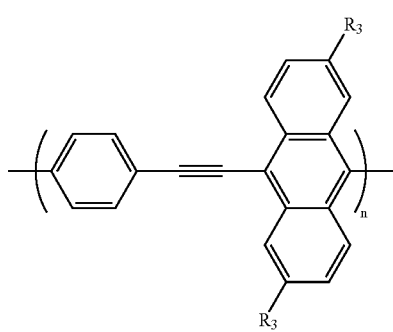
(4)
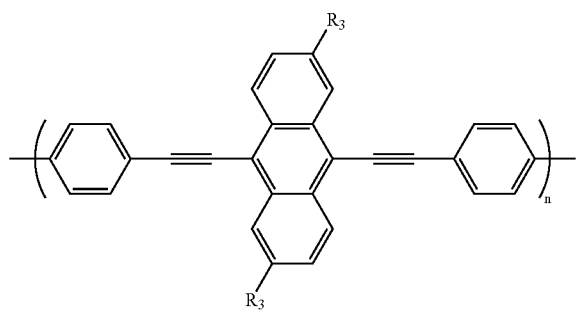
(5)
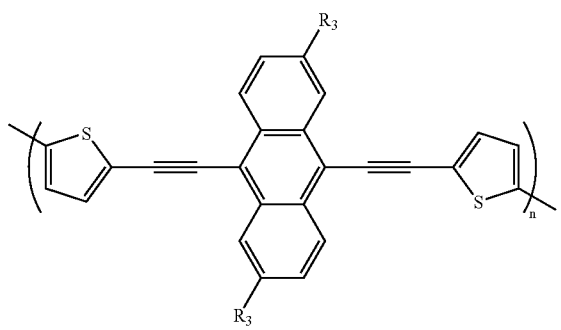
(6)
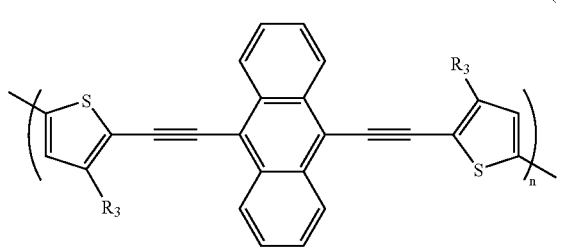
-continued
(7)
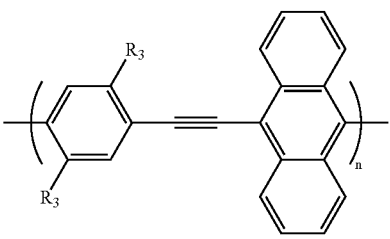
(8)
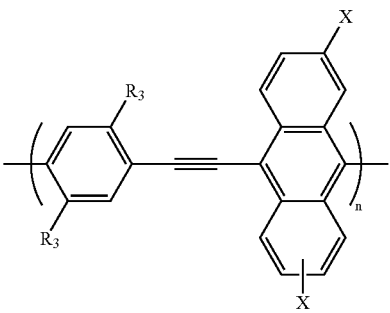
(9)
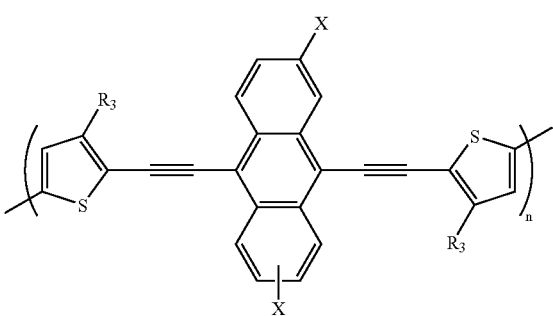
(10)
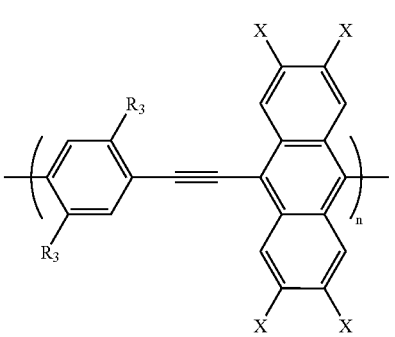
(11)
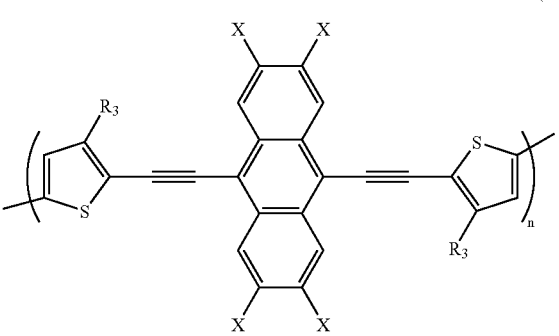

-continued
(12)
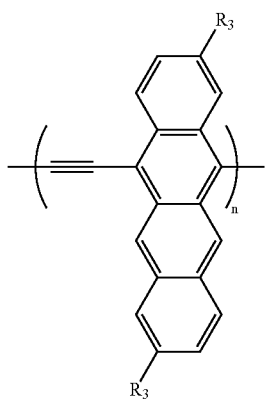
(13)
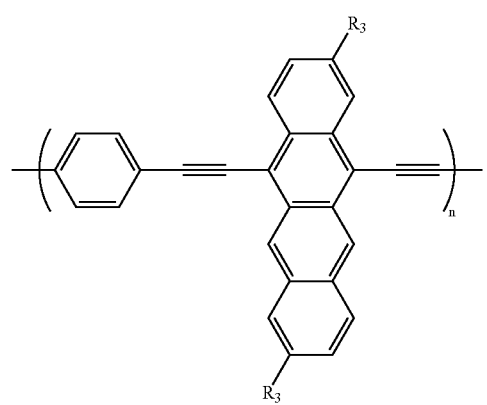
(14)
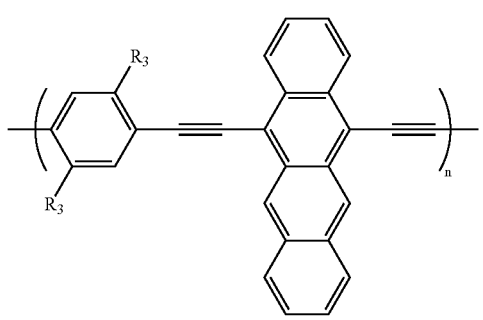
(15)
-continued
(16)
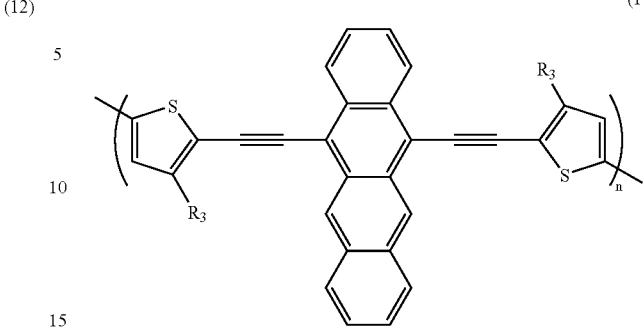
(17)
(18)
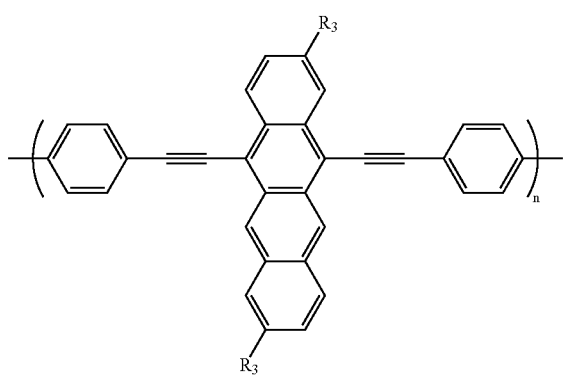

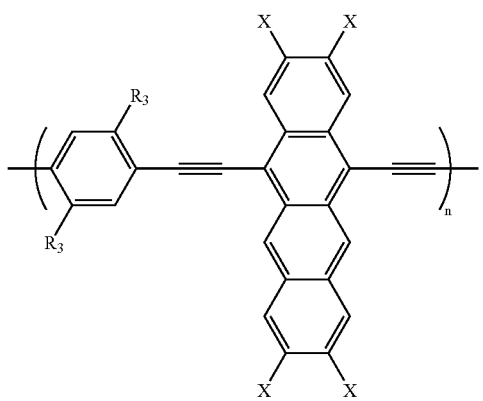
(19)
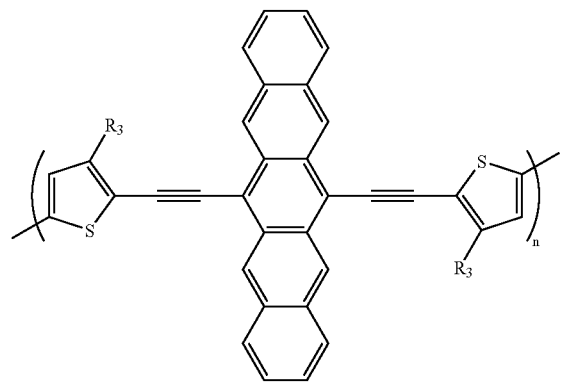
(22)
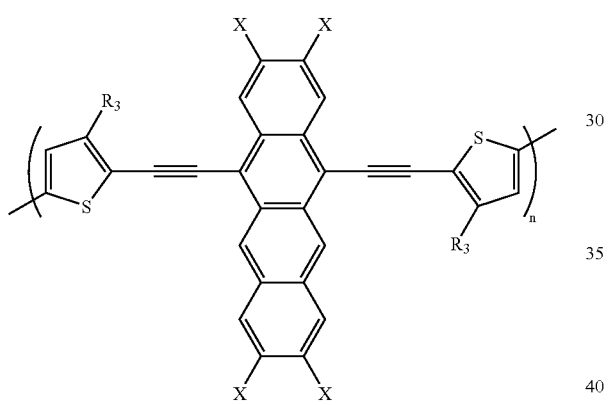
(20)
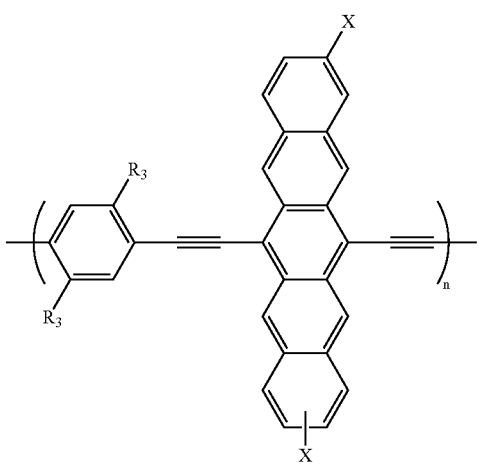
(23)
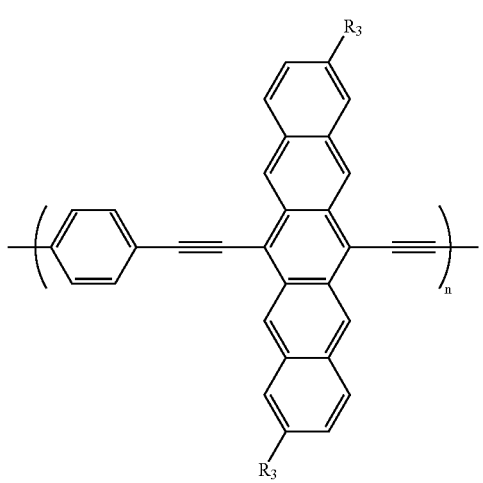
(21)
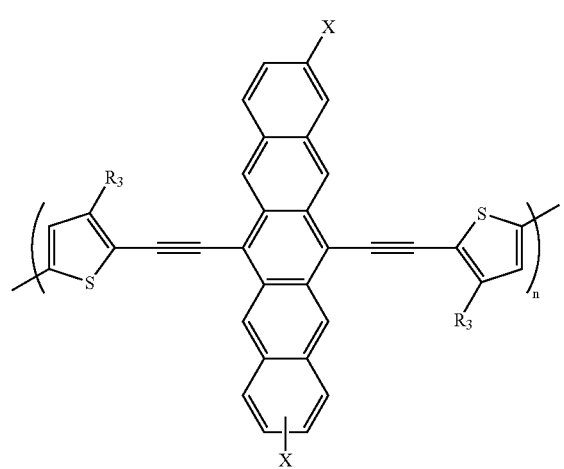
(24)

-continued
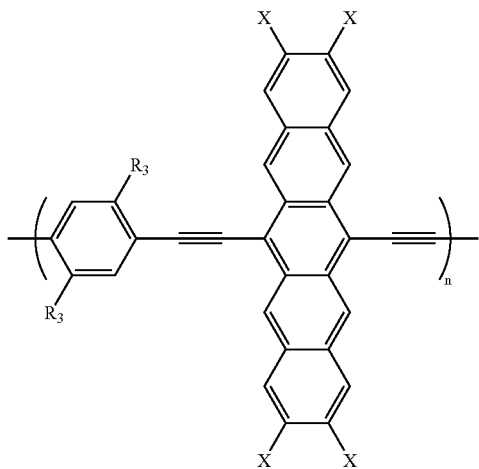
(25)
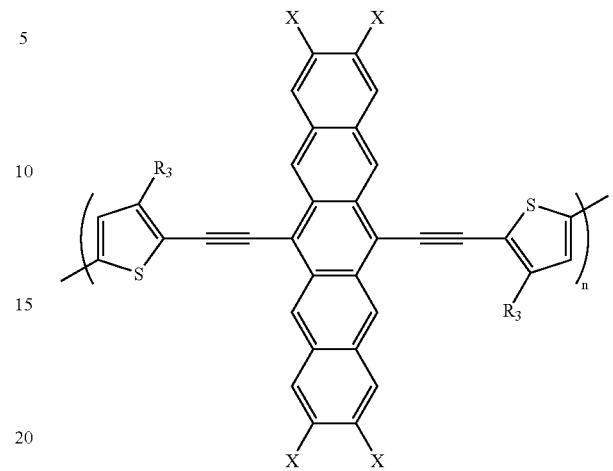
(26)
wherein $R_3$ is alkyl having from 4 to 18 carbon atoms, phenyl substituted with one alkyl chain having 4 to 18 carbon atoms, or alkoxy having from 4 to 20 carbon atoms; wherein X is methyl, $CF_3$, $NO_2$, CN, F, or Cl; and wherein n is from 2 to about 1,000.
* * * * *

UNITED STATES PATENT AND TRADEMARK OFFICE
CERTIFICATE OF CORRECTION

PATENT NO.         : 7,586,120 B2
APPLICATION NO.    : 11/399169
DATED              : September 8, 2009
INVENTOR(S)        : Yuning Li et al.

Page 1 of 1

It is certified that error appears in the above-identified patent and that said Letters Patent is hereby corrected as shown below:

In the Specifications:

Column 1, line 10, after "Agreement No.", please delete "70NANBOH3033" and insert --70NANB0H3033--.

Signed and Sealed this
Third Day of September, 2013

Teresa Stanek Rea
*Acting Director of the United States Patent and Trademark Office*